United States Patent [19]

Blossfeld et al.

[11] Patent Number: 4,992,843
[45] Date of Patent: Feb. 12, 1991

[54] COLLECTOR CONTACT OF AN INTEGRATED BIPOLAR TRANSISTOR

[75] Inventors: Lothar Blossfeld, Freiburg; Christoph Volz, Emmendingen, both of Fed. Rep. of Germany

[73] Assignee: Deutsche ITT Industries GmbH, Freiburg, Fed. Rep. of Germany

[21] Appl. No.: 433,406

[22] Filed: Nov. 3, 1989

Related U.S. Application Data

[63] Continuation of Ser. No. 123,830, Nov. 23, 1987, abandoned.

[30] Foreign Application Priority Data

Dec. 18, 1986 [EP] European Pat. Off. .......... 86117692

[51] Int. Cl.⁵ ............ H01L 29/72; H01L 27/12; H01L 29/06
[52] U.S. Cl. .................... 357/34; 357/35; 357/49; 357/55; 357/59
[58] Field of Search ............ 357/35, 34, 55, 49, 357/594

[56] References Cited

U.S. PATENT DOCUMENTS

| | | | |
|---|---|---|---|
| 4,339,767 | 7/1982 | Horng et al. | 357/35 |
| 4,674,173 | 6/1987 | Hahn et al. | 357/34 |
| 4,711,017 | 12/1987 | Lammert | 357/34 |
| 4,733,287 | 3/1988 | Bower | 357/35 |
| 4,769,687 | 9/1988 | Nakazato et al. | 357/35 |

FOREIGN PATENT DOCUMENTS

| | | |
|---|---|---|
| 0071665 | 2/1983 | European Pat. Off. . |
| 1292761 | 9/1964 | Fed. Rep. of Germany . |
| 2621165 | 9/1976 | Fed. Rep. of Germany . |
| 547012 | 3/1974 | France . |

OTHER PUBLICATIONS

Wieder, "Processing for a Lateral PNP Transistor in the Submicron Range", IBM Technical Disclosure Bulletin, vol. 21, No. 10, Mar. 1979.
Konsumelektronik "Fur Technologisch Interessierte: V-Groove-Prozeß", 10/18.5, 1984, pp. 68–69.

Primary Examiner—Andrew J. James
Assistant Examiner—Ngan Van Ngo
Attorney, Agent, or Firm—Thomas L. Peterson

[57] ABSTRACT

A collector contact (6) is fabricated which is attached on the side to the collector zone (1), and around which a moat (3) is produced which laterally restricts the collector zone (1). The depth of the moat (3) is so dimensioned to be at least equal to the vertical thickness of the collector zone (1). The collector contact (6) comprises a polycrystalline silicon layer which contains dopants of the same conductivity type as the collector zone (1), and covers a highly doped contacting zone (7') which has been diffused from the adjoining collector contact (6).

2 Claims, 3 Drawing Sheets

COLLECTOR CONTACT OF AN INTEGRATED BIPOLAR TRANSISTOR

This is a continuation, of application Ser. No. 123,830 filed Nov. 23, 1987, now abandoned.

BACKGROUND OF THE INVENTION

1. Field of the Invention

The invention deals with a structure for a space-saving contact to an integrated bipolar transistor and a method of fabricating the same.

2. Description of the Prior Art

As is well known, contacts are applied to the contact zones in an integrated circuit by a method of lateral extension as is described on pages 68 and 69 of the German technical journal *Elektronik*, 10(of May 18, 1984).

Moreover, contact with the collector zone on the bottom surface of a U-shaped moat surrounding the base zone is shown in German patent publication No. DE-A26 21 165.

However, each of these prior art structures require a predetermined planar area of the chip in order to achieve a good low resistance contact with underlying regions in the transistor, particularly as is required by the collector contact of a bipolar transistor. What is needed then is a structure for an integrated circuit contact and a method of making the same whereby these requirements are avoided or at least minimized.

BRIEF SUMMARY OF THE INVENTION

The invention relates to a collector contact of an integrated bipolar transistor such as the type transistor shown in the aforementioned DE-A No. 26 21 165, whose collector zone of the one conductivity type is insulated on the main surface of a planar semiconductor substrate of silicon of the other conductivity type, and which is insulated from the remaining semiconductor devices of a monolithic integrated solid-state circuit by way of a U-shaped moat completely surrounding the collector zone. This structure is included in that generally shown in connection with the Figures.

It is the object of the invention to provide a space-saving contact in the collector zone. The collector contact is chiefly disposed in a vertical extension or direction.

According to the invention, this aforementioned object is achieved by reason of:

(1) the collector contact of the collector zone being disposed on the side wall of the moat and comprising a layer of polycrystalline silicon with dopants of the same conductivity type of the collector zone;

(2) the collector contact covering up a highly doped contact zone of the conductivity type of the collector zone;

(3) the bottom surface of the moat being covered with a layer of silicon dioxide; and (4) the depth of the moat being at least equal to the thickness of the collector zone.

In a further embodiment of the collector contact according to the invention, a conductor lead of doped polycrystalline silicon is provided directly beneath the layer of silicon dioxide, which lead is disposed on an additional layer of silicon dioxide surrounding the conductor leads with the layer of silicon dioxide which is already disposed on the bottom surface of the moat. In this way, and without involving any further investment in space, it is possible to obtain a conductor network disposed in the depth of the semiconductor body, which may either serve to shield the individual components of the integrated circuit or else serve as a conductive network coupled to the devices in the integrated circuit.

In the following, the invention will be explained with reference to an example of embodiment which is compatible with the prior art method as disclosed in the European Application No. EP-A 0 071 665. According to this conventional method, the emitter area is covered up by means of an oxidation masking layer and, a base zone is formed with a base-contacting zone by means of an implantation mask employing two ion-implantation processes at defined different acceleration voltages. To the extent that the conventional methodology is utilized in the methodology of the invention, it is set forth in detail.

More particularly, the invention is an improvement in a monolithic integrated solid state circuit having a plurality of devices. The improvement is in a collector contact on the main surface of a planar semiconductor substrate of silicon of a first conductivity type. The collector contact is formed as part of an integrated bipolar transistor. The transistor has a collector zone with a vertical dimension and a second conductivity type. The collector zone is insulated from the plurality of devices by means of a moat which completely surrounds the collector zone of the transistor. The moat has sidewalls extending a predetermined depth to a bottom surface of the moat. The improvement comprises a collector contact of the collector zone which is disposed on the sidewall of the moat and is comprised of a layer of polycrystalline silicon provided with dopants of the second conductivity type of the collector zone. The collector contact covers a highly doped contacting zone of the second conductivity type of the collector zone. The bottom surface of the moat is covered with a first layer of silicon dioxide. The depth of the moat is at least equal to the vertical dimension of the collector zone.

The improvement further comprises a second layer of silicon dioxide and a conductor lead of doped polycrystalline silicon disposed directly beneath the first layer of silicon dioxide. The conductor lead, in turn, is disposed on the second layer of silicon dioxide. The second silicon dioxide layer surrounds the conductor lead together with the first layer of silicon dioxide as disposed on the bottom surface of the moat.

The invention is also a method of fabricating a collector contact in a monolithic integrated solid state circuit having a plurality of devices, and a collector contact on the one main surface of a planar semiconductor substrate of silicon of a first conductivity type. The collector contact is formed as part of an integrated bipolar transistor. The transistor has a collector zone with a vertical dimension and a second conductivity type. The collector zone is insulated from the plurality of devices by means of a moat which completely surrounds the collector zone of the transistor. The moat has sidewalls extending a predetermined depth to a bottom surface of the moat. The method comprising the steps of forming a monocrystalline silicon layer of the second conductivity type on the main surface of the semiconductor substrate of the first conductivity type. A moat is formed by anisotropically etching through the monocrystalline silicon layer. A rim portion of the collector zone is simultaneously exposed with formation of the moat. The main surface of the semiconductor substrate and the surface portions of the moat are covered with a thermally grown dioxide layer which forms a sidewall dioxide layer. A layer of silicon nitride is deposited onto the thermally grown dioxide layer. Portions of the silicon nitride layer on both the sidewall and bottom surface of the moat are anisotropically and selectively etched away. The silicon dioxide layer is selectively etched so that the bottom surface of the moat and selected portions of the main semiconductor surface are exposed. Ions of the second conductivity type are implanted into the exposed parts of the main semiconductor surface and into the bottom surface of the moat. The implanted ions form a channel-interrupter zone in the bottom of the moat and, at the same time, a base zone of the bipolar transistor. A thermal oxidation layer is formed on the exposed silicon on the bottom surface of the moat. The oxidation layer forms an insulating layer on the bottom of the moat whose thickness exceeds the thickness of the sidewall dioxide layer. The relatively thin sidewall dioxide layer is removed by etching. The insulating layer on the bottom of the moat is essentially preserved. A polycrystalline layer of silicon is then disposed which contains dopants of the second conductivity type of the collector zone. The doped polycrystalline silicon on both the bottom surface of the moat and the main surface is then selectively removed by an anisotropic etch. A collector contact is then formed by thermally diffusing in the dopants from the remaining portion of the doped polycrystalline layer which covers an adjacent contacting zone of the second conductivity type of the collector zone on the sidewalls of the moat.

In one embodiment, after the step of depositing the silicon nitride layer, an emitter area is masked in order thus to protect the emitter area from attack by etching. The steps of anisotropically etching the silicon nitride layer and selectively etching the silicon dioxide layer to expose the semiconductor material on the bottom surface of the moat as well as around the emitter area and around the collector-contacting area is then performed. The masking layer is then removed. In the course of the step of implanting the ions in an arbitrary order of sequence at a selected plurality of energy levels, the ions of the first conductivity type are implanted at such a first accelerating voltage that the sequence of layers comprising the dioxide layer and the nitride layer is penetrated. Ions are then implanted at such a second accelerating voltage that the sequence of nitride and dioxide layers masks both the emitter area and the collector-contact area. A thermal-oxidation layer is formed so that an insulating layer is disposed on the bottom surface of the moat and outside the emitter area as well as outside the collector-contact area. The step of removing the relatively thin sidewall dioxide layer in the moat is then performed, in the course of which, besides preserving the insulating layer on the bottom of the moat, the insulating layer as formed outside the emitter area and outside the collector-contact area is preserved. Those portions of the sequence of nitride and dioxide layers still remaining are then removed. During the step of depositing the doped polycrystalline layer of the second conductivity type, the polycrystalline silicon layer is deposited on the bottom of the moat. The step of removing selected portions of the doped polycrystalline layer is performed by using an etch mask which defines a contacting area of the collector electrode on the main surface and an emitter electrode. The contacting area of the collector electrode overlaps the rim portion of the insulating layer as formed outside the emitter area. In the course of the step of forming the collector contact with an adjoining contacting zone by thermal diffusion from the doped polycrystalline later, an emitter electrode with an adjoining emitter zone is also formed.

Turn now to the following drawings wherein like elements are referenced by like numerals.

BRIEF DESCRIPTION OF THE DRAWINGS

FIG. 1 is a cross-sectional view of a planar semiconductor substrate showing a moat formed into a collector zone.

FIG. 2 is the cross-sectional view of FIG. 1 with a silicon dioxide and silicon nitride layer disposed thereon.

FIG. 3 is the cross-sectional view of FIG. 2 with portions of the silicon dioxide and silicon nitride layer selectively removed by use of a masking layer selectively disposed thereon.

FIG. 4 is the cross-sectional view of FIG. 3 with the masking layer removed and the substrate being subjected to a first ion implantation step.

FIG. 5 is the cross-sectional view of FIG. 4 after a silicon dioxide layer has been thermally grown thereon.

FIG. 6 is the cross-sectional view of FIG. 5 after the previously disposed silicon dioxide and silicon nitride layers have been removed.

FIG. 7 is the cross-sectional view of FIG. 6, as also shown in plan view in FIG. 8, after a doped polysilicon layer has been selectively disposed thereon and the dopant diffused into the underlying exposed portions of the device.

DETAILED DESCRIPTION OF THE PREFERRED EMBODIMENTS

A collector contact 6 is fabricated which is attached on the side to the collector zone 1, and around which a moat 3 is produced which laterally restricts the collector zone 1. The depth of the moat 3 is so dimensioned to be at least equal to the vertical thickness of the collector zone 1. The collector contact 6 comprises a polycrystalline silicon layer which contains dopants of the same conductivity type as the collector zone 1, and covers a highly doped contacting zone 7' which has been diffused from the adjoining collector contact 6.

The illustrated embodiment described below is in the context of an integrated NPN bipolar transistor which is characterized by its favorable high-frequency or switching properties. It is to be expressly understood, however, that a collector contact can also be fabricated according to the invention in any integrated PNP bipolar transistor without departing from the scope of the invention by suitably selecting a different conductivity type.

Figure 1:
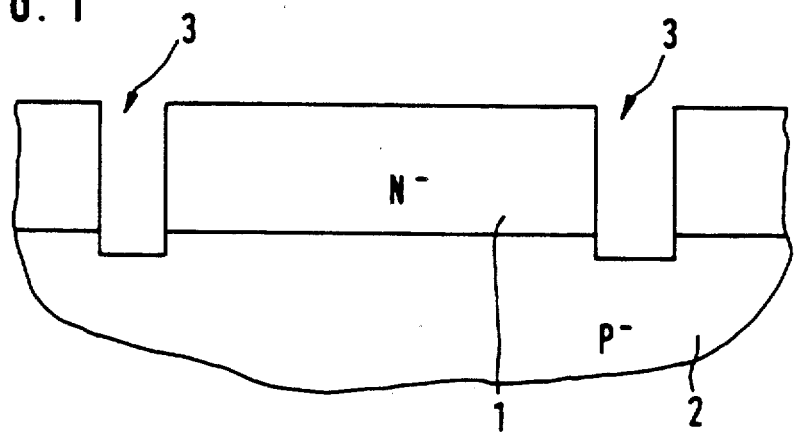
FIGS. 1 to 7 are cross-sectional views in exaggerated scale of an integrated bipolar transistor, which views serve to sequentially illustrate the successive processing steps of the method according to the invention.

In the preferred embodiment the illustrated process starts with a weakly doped p-conductive semiconductor substrate 2 as shown in FIG. 1. A weakly n-conductive monocrystalline layer of silicon is produced preferably by way of ion implantation on the main surface of substrate 2. The collector zone 1, as shown in FIG. 1, extends through the monocrystalline silicon layer and is restricted or defined by an anisotropic etching of the moat 3. The depth of the moat 3 must be at least equal to the thickness of the collector zone 1 in order to reliably safeguard the electrical separation of the bipolar transistor to be fabricated from the remaining components of the integrated solid-state circuit.

Anisotropic etching processes, which are carried out exclusively from the gas phase, are well known for the etching of semiconductor material as well as silicon dioxide and silicon nitride, and are therefore not described in detail herein.

Figure 2:
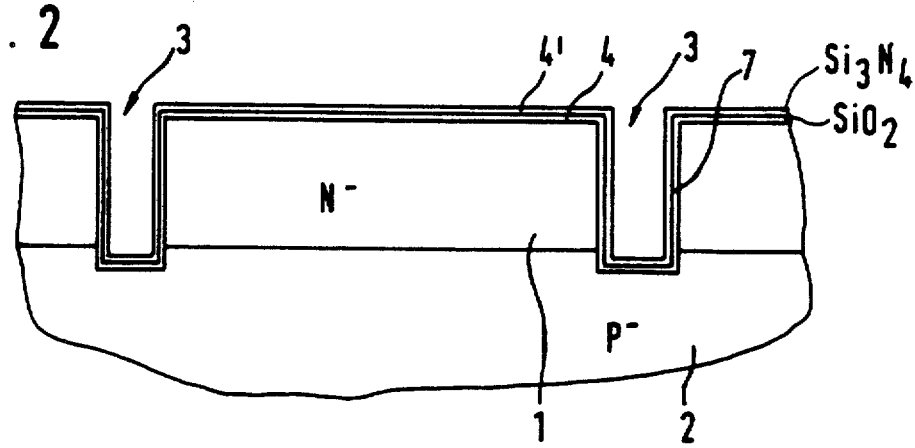

Following the fabrication of the collector zone 1, the exposed surface portions or parts of the main surface of the semiconductor substrate 2, including the surface portions of the moat 3, are covered with a thermally grown layer of dioxide 4 as shown in FIG. 2. The latter contains the sidewall layer of dioxide 7. A layer of silicon nitride 4' is deposited onto the thermally grown dioxide layer 4. This is then followed by an anistropic nitride etching, hence by a selective etching of the layer of silicon nitride in such a way that the unmasked portions of the nitride layer on both the main and the bottom surface of the moat are removed.

Figure 3:
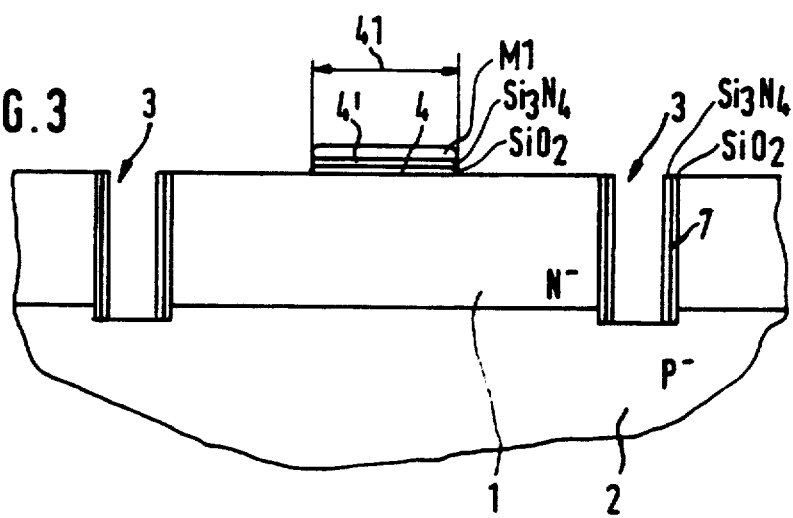

By masking portions of the sequence of layers 4, 4' it is possible to keep a contact area of the collector electrode, on both the main surface and the emitter area, free from a thermally produced insulating layer. In this way, when suitably dimensioning the thickness of layers 4, and 4', the method of the invention becomes compatible with EP-A No. 0 071 665 which describes a method for fabricating a self-aligned emitter and base included in a base-contact zone. To the extent that this compatible methodology is utilized in the methodology of the invention, it is set forth below in detail. For example as shown in FIG. 3 of the drawings, and consistent with the method disclosed in EP-A No. 0 071 665, both the emitter area 41 and the collector-contact area, not shown in the cross-sectional view of FIG. 3, are protected from the etch by a masking layer M1 of photoresist. An anisotropic nitride etch in the preferred vertical direction relative to the main surface is effected with the nitride layer, of course, being preserved on the sidewall of the moat as well as beneath the masking layer M1.

After that a normal dioxide etching is carried out, in the course of which the nitride layer on the sidewall of the moat 3 as well as the masking layer M1 are masked. Consequently, the bottom surface of the moat 3, as well as the semiconductor material around both the emitter area 41 and the collector-contact, are exposed as shown in FIG. 3.

Figure 4:
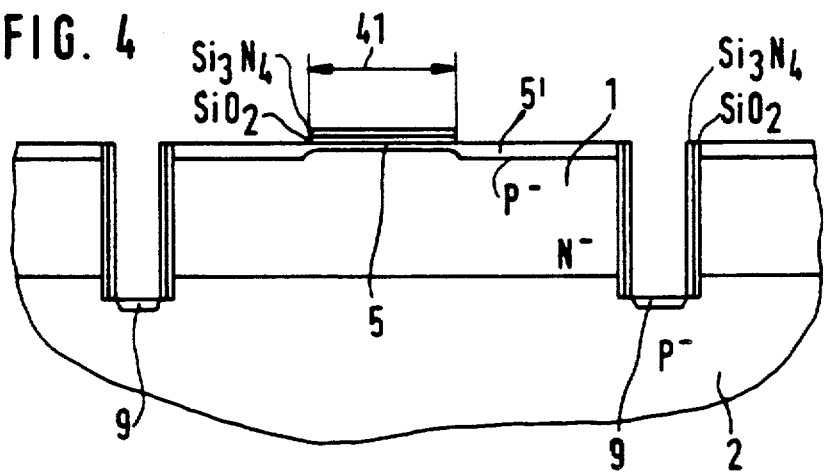

Ions of the conductivity type of the semiconductor substrate 2, hence p-conductive ions, are then implanted into the exposed parts of the semiconductor surface, as described in EP-A No. 0 071 665 for the purpose of fabricating the graduated or stepped base zone below the emitter zone which is still to be produced. At a temperature sufficiently high to permit activation, these ions then form the channel-interrupting zone 9 as shown in FIG. 4 in the bottom of moat 3. Again the relevant aspects of the process described in EP-A No. 0 071 665 are outlined below.

Consistent with EP-A No. 0 071 665, in the preferred embodiment of the invention, ions of the substrate conductivity type are selectively implanted in an optional sequence at such a first accelerating voltage as to penetrate the sequence of layers comprised of oxide layer 4 and nitride layer 4', and at such a second accelerating voltage so as to masked by the sequence of layers 4, 4' on both the emitter area and the collector-contact area. The arrangement as shown in the sectional view of FIG. 4 is the result, including an active base zone 5 and base-contacting zone 5'. Prior to the implantation of the p-doped impurities, however, the masking layer M1 is carefully removed.

Figure 5:
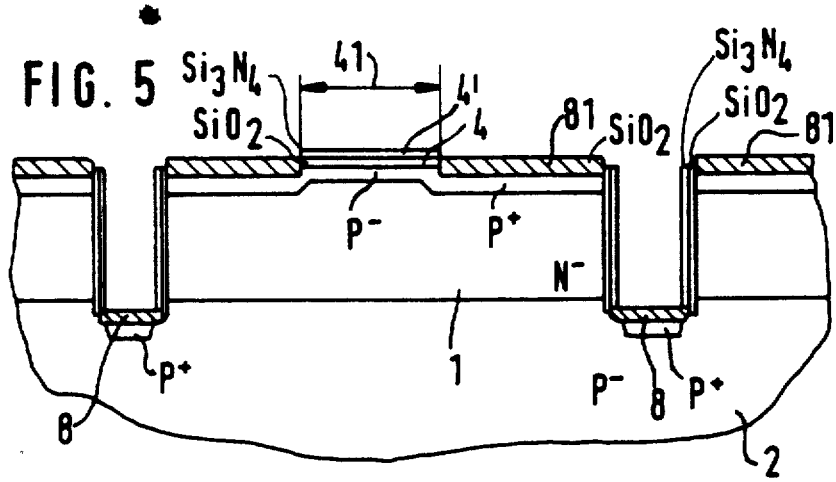

After that, there follows a step of thermal oxidation in the course of which an insulating layer 8 is formed on the bottom surface of moat 3, and an insulating layer 81 on the main surface, with the latter extending around the emitter area 41 and the collector-contact area not shown in FIG. 5 but lying behind the plane of the Figure.

Figure 6:
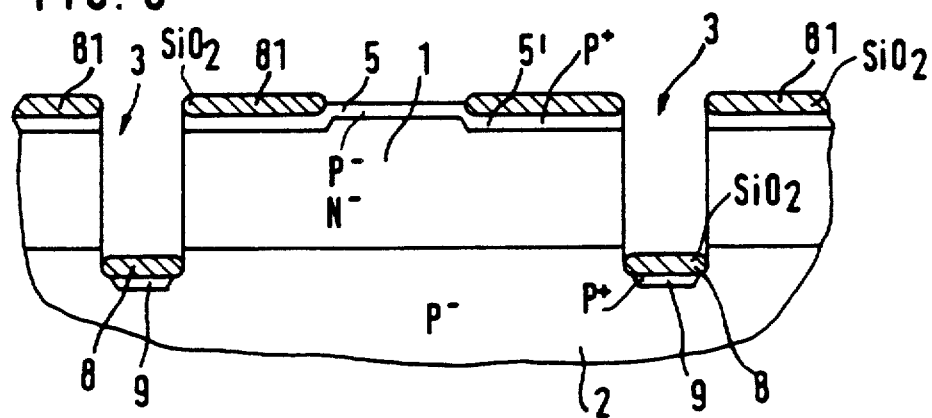

Next, those portions of the sequence of layers 4, and 4' as still remain on the emitter area 41 and the sidewall surface, are removed by employing a normal nitride etching prior to a normal oxide etching step, as is illustrated in FIG. 6. Considering that the oxide layer 4 of the sequence of layers 4, and 4' is substantially thinner than the silicon dioxide layers 81 and 8, a normal isotropic etching process can be carried out during the gas phase, which is stopped in time so that both the insulating layer 8 on the bottom of the moat 3 and the insulating layer 81 outside the emitter area 41 and outside the collector-contact area will be essentially preserved.

Figure 7:
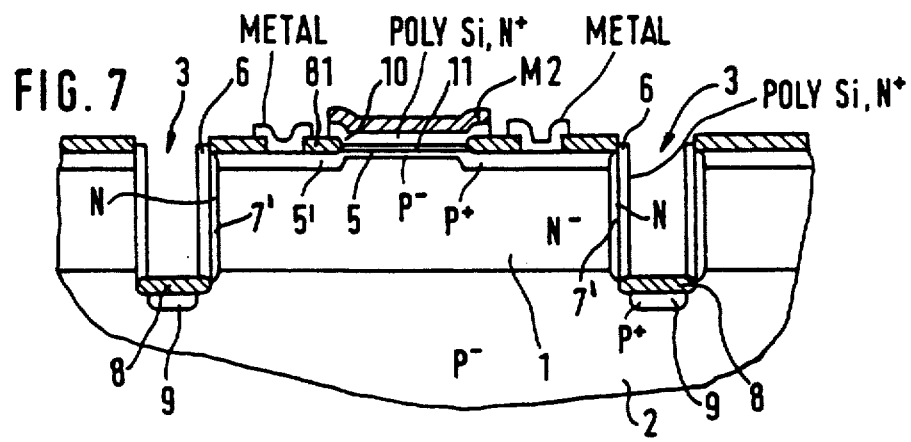
Figure 8:
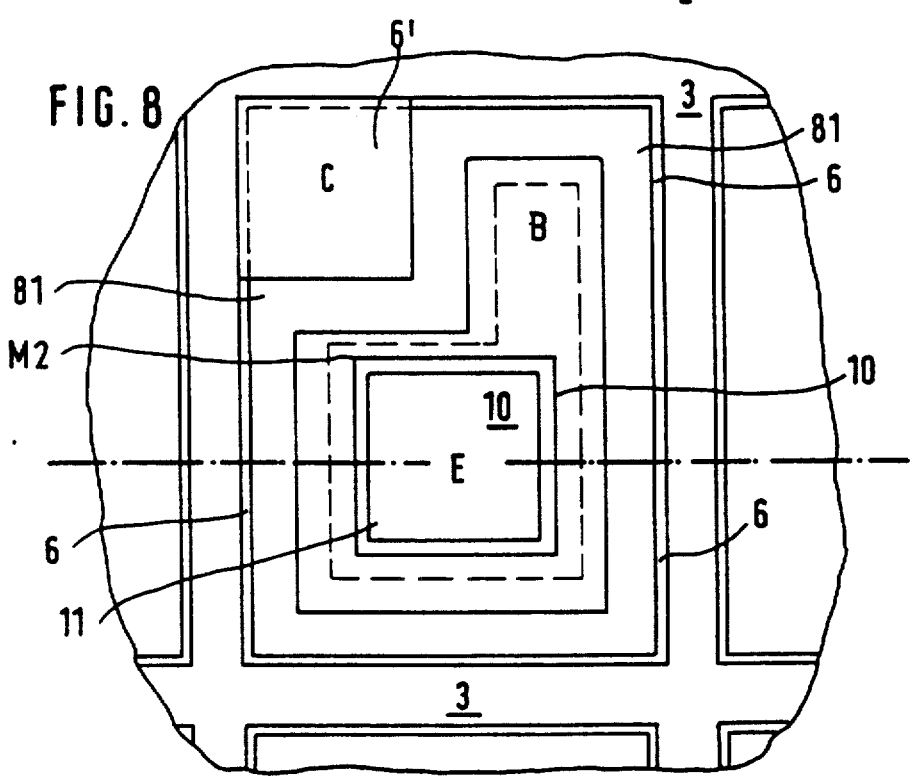
FIG. 8 is a plan view of the device shown in FIG. 7 which is taken through section lines 7—7 of FIG. 8.

Following both the nitride etching and the oxide etching processes for removing the relatively thin sequence of layers 4, and 4', on the sidewall of the moat 3 and on the emitter area 41, a doped polycrystalline silicon layer is deposited onto the main surface chip, with this layer containing dopants of the conductivity type of the collector zone. This step is to allow fabrication a collector contact and/or an emitter zone of the bipolar transistor, whose areas are masked on the polycrystalline silicon layer by means of an etch-masking layer, preferably of photoresist. In the example of the embodiment as shown in FIG. 7, an etch mask M2 (not shown) is used to define, as can be seen from FIG. 8, a contacting area 6' on the main surface for both the collector electrode 6 and the emitter electrode 10, which overlaps the rim portion of the insulating layer 81 as formed outside the emitter area 41. In the course of a following high-temperature process, various zones are diffused from the remaining parts of the n-doped polycrystalline silicon layer, namely the emitter zone 11 is diffused from the emitter electrode 10, a collector-contacting zone, not shown in the cross-sectional view of FIG. 7, is diffused from the contacting area 6' which is formed on a border on the main surface, and a band- or tape-shaped collector-contacting zone 7' which frames collector zone 1 is diffused from electrode 6 bordering on the lateral surface of the collector zone 1 defined by the sidewalls of moat 3. This collector-contacting zone 7' forms one p-n junction with each outer base-zone portion 5' as well as with the p-conductive semiconductor substrate 2.

An extremely space-saving and low-ohmic contacting results from the sidewall contact of collector zone 1. The contacting surface C for one conductor lead is provided on the main surface, which surface C can be dimensioned to be as small as the emitter-contacting surface E and the base-contacting surface B.

Figure 9:
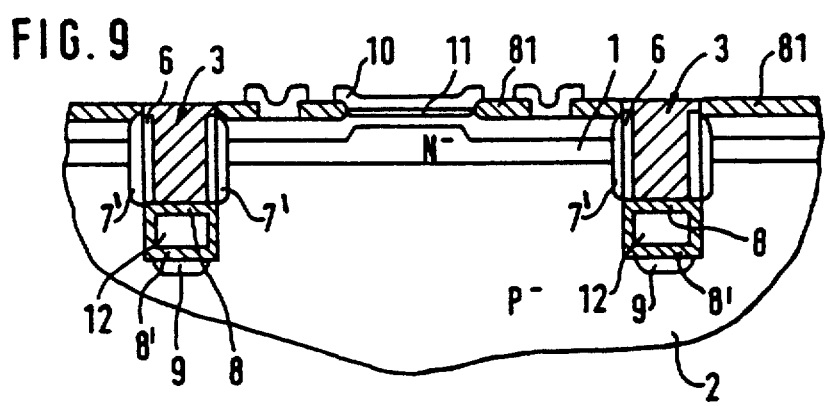
FIG. 9 is a cross-sectional view of a second embodiment of the invention wherein conductive lines are disposed in the bottom of the moat.

As is explained with reference to FIG. 9, the collector contact can also be effected with the aid of a conductor lead 12 of polycrystalline silicon which is disposed directly beneath the silicon dioxide layer 8 on the bottom surface of the moat 3.

Conductor lead 12 of doped polycrystalline silicon can be inserted into the moat 3 after the sequence of layers 4, and 4' has been produced according to FIG. 2. It can be superficially provided with a further layer of silicon dioxide 8' by a thermal oxidation step, so that an additional conductor-lead level will result which may be connected to chassis or frame, either for the purpose of connecting the collector zones or else for effecting the electrical shielding of the collector zones from one another.

The moats or, in particular the moat 3, can be filled up with an insulating material by employing one of the well-known planar-diffusion processes in order thus to form a flat or plane wiring surface for conductor leads on the main surface.

Many modifications may be made by those having ordinary skill in the art without departing from the scope of the present invention. Therefore, it must be understood that the illustrated embodiments have been shown only for the purpose of example and should not be read as limiting the invention which is defined in the following claims.

We claim:

1. In a monolithic integrated solid state circuit having a plurality of devices, an improvement in a collector contact on a main surface of a planar semiconductor substrate of silicon of a first conductivity type, said main surface defining a horizontal direction, said collector contact formed as part of an integrated lateral bipolar transistor, said transistor having a collector zone with a vertically disposed planar surface forming part of said collector zone, said planar surface forming a vertical dimension of said collector zone, and said collector zone using a portion of horizontal area of said main surface of said planar semiconductor substrate, said collector zone being doped by a second conductivity type and being insulated from said plurality of devices by means of a moat which completely surrounds said collector zone of said transistor, said moat having a bottom and vertical sidewalls extending a predetermined depth to said bottom of said moat, said improvement comprising:

a vertically elongated collector contact of said collector zone disposed on and extending down said vertical sidewall of said moat to use a minimal amount of horizontal space of said main surface of said planar semiconductor substrate, said minimal amount of horizontal space used by said collector zone, and said vertically elongated collector contact comprised of a layer of polycrystalline silicon provided with dopants of said second conductivity type of said collector zone, said collector contact covering a highly doped contacting zone of said second conductivity type defined in said collector zone, said bottom of said moat being covered with a first layer of silicon dioxide, and said depth of said moat being at least equal to said vertical dimension of said collector zone, whereby a minimal portion of said main surface is used for contact with said collector contact.

2. An improved collector contact to a collector zone of a lateral bipolar transistor in an integrated multi-device circuit, said collector zone being generally planar, extending horizontally to define a horizontally extending surface, and having a depth substantially less than any horizontal dimension, said collector zone being isolated at least in part by a vertically extending moat, said moat having a depth, a vertical sidewall and a bottom, comprising:

a thin vertically extending conductive layer disposed on said vertical sidewall of said moat, said conductive layer comprising a layer of polycrystalline silicon with dopants of the same conductivity type of said collector zone;

a highly doped contact zone of said conductivity type of said collector zone defined in said collector zone and adjacent to said vertical sidewall;

a collector contact electrically coupled to an upper rim segment of said vertically extending conductive layer so that a minimal amount of said horizontal extending surface of said collector is required for said collector contact; and a first insulating layer disposed on and covering said bottom of said moat, said depth of the moat being at least equal to the thickness of the collector zone.

* * * * *